United States Patent
Young (10) Patent No.: US 7,132,851 B2
(45) Date of Patent: Nov. 7, 2006

(54) COLUMNAR FLOORPLAN (75) Inventor: Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/618,404

(22) Filed: Jul. 11, 2003

(65) Prior Publication Data
US 2005/0007147 A1 Jan. 13, 2005

(51) Int. Cl.
H03K 19/177 (2006.01)

(52) U.S. Cl. .......................... 326/41; 326/47

(58) Field of Classification Search ............ 326/37–39, 326/41, 47
See application file for complete search history.

(56) References Cited

U.S. PATENT DOCUMENTS

| | | | |
|---|---|---|---|
| 4,978,633 A * | 12/1990 | Seefeldt et al. ............. | 438/113 |
| 5,016,080 A | 5/1991 | Giannella et al. | |
| 5,068,603 A | 11/1991 | Mahoney et al. | |
| 5,164,619 A | 11/1992 | Luebs | |
| 5,341,049 A * | 8/1994 | Shimizu et al. ............. | 326/101 |
| 5,394,443 A | 2/1995 | Byers et al. | |
| 5,467,040 A | 11/1995 | Nelson et al. | |
| 5,773,854 A | 6/1998 | Pasch et al. | |
| 5,880,598 A | 3/1999 | Duong et al. | |
| 5,914,616 A | 6/1999 | Young et al. | |
| 5,999,039 A | 12/1999 | Hoist et al. | |
| 6,204,689 B1 | 3/2001 | Percy et al. | |
| 6,255,848 B1 | 7/2001 | Schultz et al. | |
| 6,396,302 B1 | 5/2002 | New et al. | |
| 6,433,606 B1 | 8/2002 | Arai | |
| 6,487,708 B1 | 11/2002 | Canaris | |
| 6,489,820 B1 | 12/2002 | Humphrey et al. | |
| 6,538,470 B1 | 3/2003 | Langhammer et al. | |
| 6,617,877 B1 * | 9/2003 | Cory et al. .................... | 326/41 |
| 6,781,407 B1 * | 8/2004 | Schultz ......................... | 326/41 |
| 2001/0030555 A1 | 10/2001 | Witting et al. | |

OTHER PUBLICATIONS

Xilinx, Inc.; DS083-2 (v2.7) Advance Product Specification; "Virtex-II Pro Platform FPGAs: Functional Description"; available from Xilinx, Inc., 2100 Logic Drive, San Jose, California 95124; pp. 1-48.

Xilinx, Inc.; DS031-2 (v1.9) Advance Product Specification; "Virtex-II Platform FPGA Handbook," available from Xilinx, Inc., 2100 Logic Drive, San Jose, California 95124; Nov. 29, 2001, pp. 77-79.

* cited by examiner

Primary Examiner—James H. Cho
(74) Attorney, Agent, or Firm—T. Lester Wallace; John J. King (57) ABSTRACT

An FPGA is laid out as a plurality of repeatable tiles, wherein the tiles are disposed in columns that extend from one side of the die to another side of the die, and wherein each column includes tiles primarily of one type. Because substantially all die area of a column is due to tiles of a single type, the width of the tiles of each column can be optimized and is largely independent of the size of the other types of tiles on the die. The confines of each type of tile can therefore be set to match the size of the circuitry of the tile. Rather than providing a ring of input/output blocks (IOBs) around the die periphery, IOB tiles are disposed in columns only. Where more than two columns worth of IOBs is required, more than two columns of IOB tiles can be provided.

19 Claims, 6 Drawing Sheets

COLUMNAR FLOORPLAN

FIELD OF THE INVENTION

The present invention relates to integrated circuits that are laid out in tiles.

BACKGROUND INFORMATION

Programmable logic devices (PLDs), such as field-programmable gate arrays (FPGAs), are user-programmable integrated circuits that can be programmed to implement user-defined logic circuits. In a typical FPGA architecture, an array of configurable logic blocks (CLBs) and a programmable interconnect structure are surrounded by a ring of programmable input/output blocks (IOBs). Configurable logic blocks can also be referred to using other names such as, for example, a logic array block (LAB) or a logic module.

In one SRAM-based FPGA, each of the CLBs, each of the IOBs, and the programmable interconnect structure includes configuration memory cells, the contents of which determine how the CLB, the programmable interconnect structure, or the IOB is configured. To realize a user-defined circuit, configuration data is loaded into the configuration memory cells such that the CLBs and IOBs are configured to realize particular circuit components used in the user-defined circuit. Configuration data is also loaded into the configuration memory cells of the programmable interconnect structure such that the programmable interconnect structure connects the various configured CLBs and IOBs in a desired manner to realize the user-defined circuit.

In addition to CLBs and IOBs, other more specialized circuits may be provided on an FPGA integrated circuit for use in user-specific designs. Examples of such other circuits include, but are not limited to, block random access memory (BRAM), multiplier circuits, processors, clock management circuitry, and high-speed transceivers.

The cost of an integrated circuit die is directly related to its size. If all other cost factors involved in the manufacture of an integrated circuit are equal, then making the integrated circuit larger will make the integrated circuit more expensive to produce. It is therefore generally an objective in FPGA integrated circuit design to lay out the circuitry of the CLBs, IOBs, and programmable interconnect using as little integrated circuit die surface area as is realistically possible. Because the layout of an integrated circuit die includes considerable engineering effort and therefore cost, FPGA integrated circuits are often laid out as a set of repeatable "tiles". The various tiles are laid out adjacent to one another such that adjacent tiles couple together at their boundaries to form the larger FPGA integrated circuit. The particular way the tiles are laid out across the surface of the FPGA die is called a floorplan.

Figure 1:
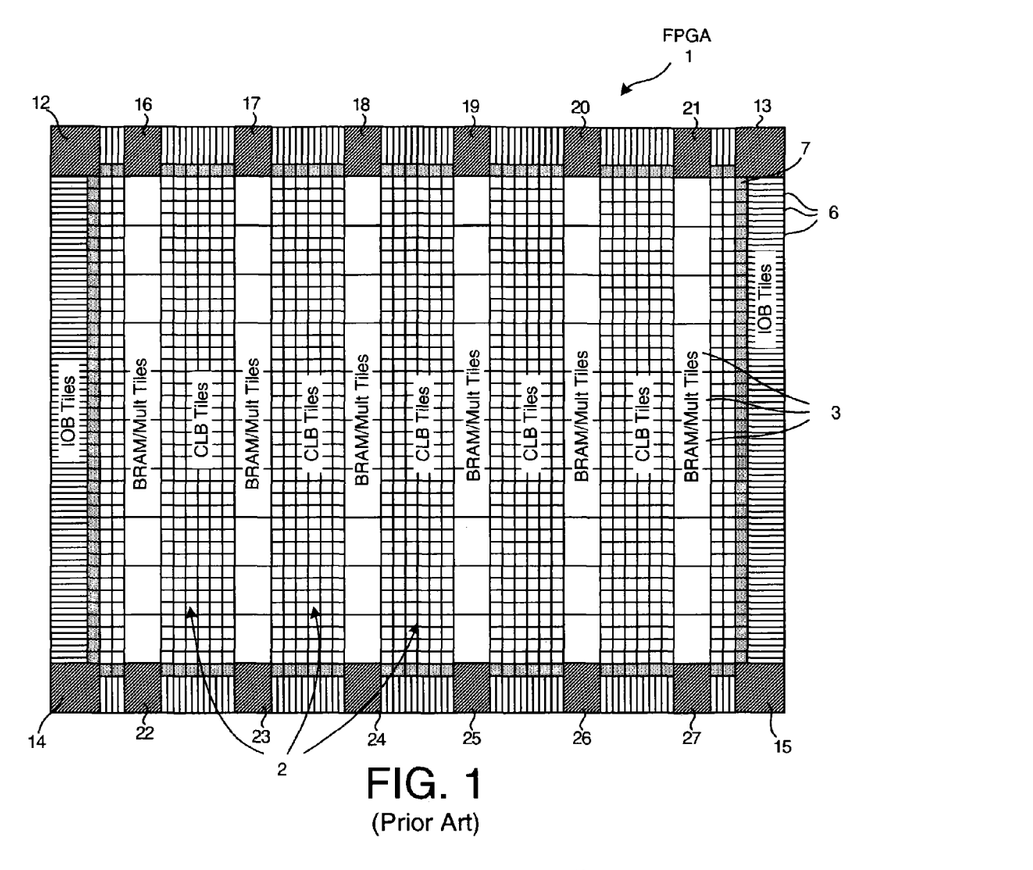
FIG. 1 (Prior Art) is a simplified top-down diagram showing how an FPGA die might be laid out using a conventional tile technique.

FIG. 1 (Prior Art) is a simplified diagram showing one way that various CLB, IOB, BRAM/multiplier tiles could be laid out to form an FPGA integrated circuit 1. The CLB tiles 2 are laid out in column-like two-dimensional arrays. In this example, each CLB tile includes a portion of the configurable interconnect structure such that the entire interconnect structure is formed by the various portions of the many CLBs when the CLB tiles are placed together on the FPGA. There are also BRAM/multiplier tiles 3. The BRAM/multiplier tiles, which are not required in as great of numbers as the CLB tiles, are laid out in columns of uniform width. For more information on the various types of tiles shown in FIG. 1, see the data sheet for the Virtex II Pro FPGA. The data sheet is available on-line in PDF form on the Xilinx, Inc. web site, www.Xilinx.com.

In order to provide a large amount of input/output circuitry for interfacing the FPGA 1 to external logic, IOB tiles 6 are provided along each of the four sides (top, bottom, left, right) of the die. In this particular design, an input/output interconnect tile (IOI tile) is used to couple each pair of IOB tiles to a CLB tile in the central core of the die. One such IOI tile is therefore disposed between each pair of IOB tiles and the central core. Reference numeral 7 points to one such IOI tile. IOI tile 7 is disposed between the two IOB tiles to its right and the CLB tile to its left.

Figure 2:
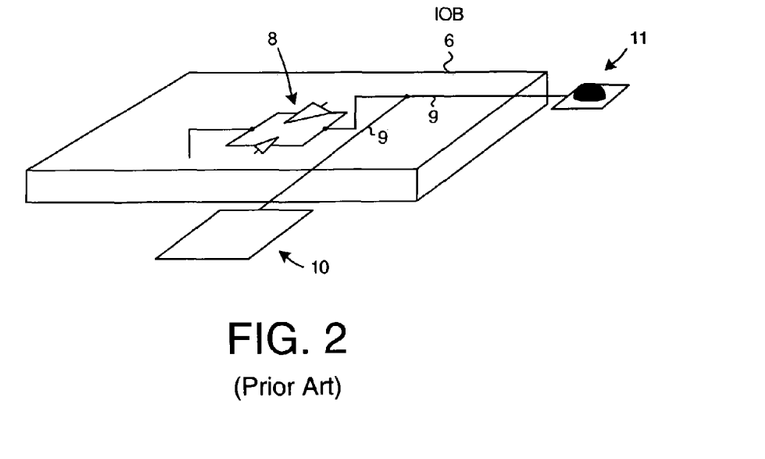
FIG. 2 (Prior Art) is a simplified perspective view of an IOB tile having an associated wire bond pad and an associated bond bump.

FIG. 2 (Prior Art) is a simplified perspective view of an IOB tile 6 of the die of FIG. 1. In this example, input/output circuitry 8 within the IOB tile is connected by conductive traces 9 to both a bond pad 10 as well as to a solder bump 11. A solder bump is sometimes called a bond bump or a microbump. The solder bump may be formed of metal in the upper metalization layers above the IOB tile itself or may be disposed outside the lateral boundary of the IOB tile as illustrated in FIG. 2. The bond pad 10 is provided so that the FPGA die can be wire bonded to an integrated circuit package. The solder bump 11 is provided so that the FPGA die can be packaged in flip-chip fashion. Providing both bond pads and solder bumps for the IOB tile makes the resulting FPGA die more versatile in that the same type die layout can used in wire bond packages and in flip-chip packages.

Providing an IOB tile with both a bond bump and a wire bond pad, however, increases total capacitive loading on input/output trace 9. This additional capacitive loading is undesirable. In addition to an undesirable increase in capacitive loading, providing both a bond bump and a wire bond pad also has the drawback of consuming additional die surface area. Wire bond pads cannot generally be disposed directly over areas of circuitry. During wire bonding, physical forces are placed on the bond pad by an external wire bonding device. The physical forces imposed on the wire bond pad may damage any circuitry that might be disposed under the wire bond pad. Consequently, providing a wire bond pad for an IOB tile generally involves consuming die surface area in addition to the amount of die surface area occupied by the circuitry of the IOB tile. If the bond pad could be eliminated from the FPGA design, then the amount of die area required to realize the IOB tiles could be reduced.

For additional information on a tile FPGA floorplan and on the general operation of an FPGA integrated circuit, see: 1) U.S. Pat. No. 5,914,616 by Young et al.; 2) the Advance Product Specification entitled "Virtex-II Pro Platform FPGAs: Functional Description", Sep. 27, 2002; 3) Published U.S. Patent Application US2001/0030555A1 by Witting et al.; and 4) U.S. Pat. No. 6,396,302, by New et al. (the subject matter of these four documents is incorporated herein by reference).

Figure 3:
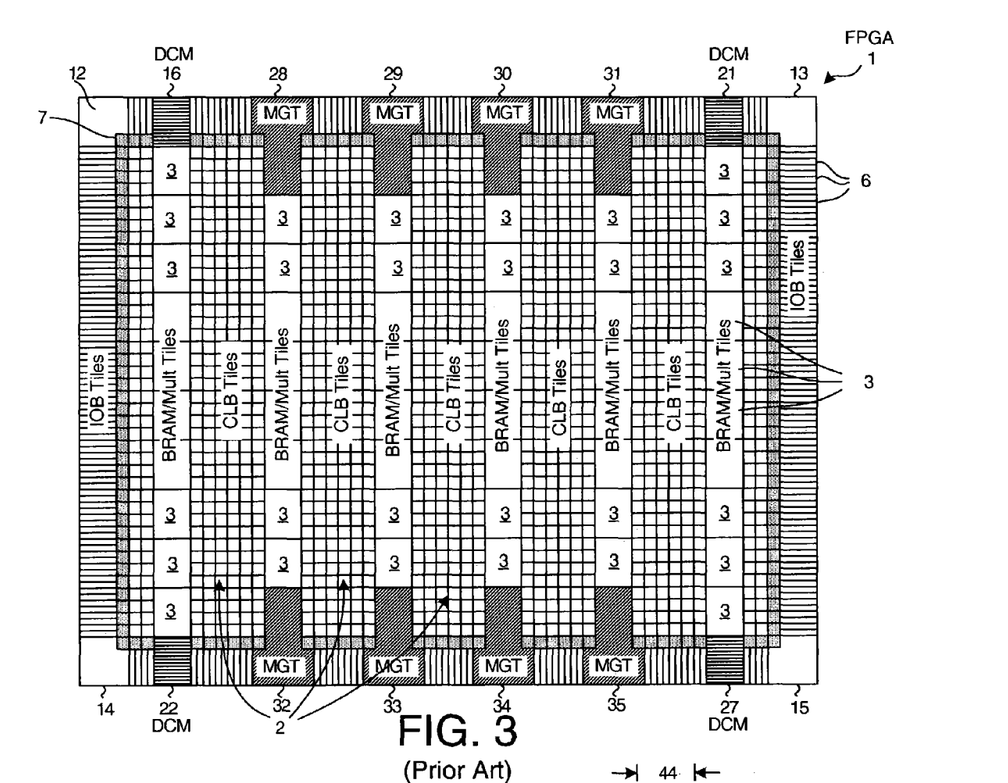
FIG. 3 (Prior Art) is a simplified top-down diagram of one particular conventional FPGA whose circuitry is laid out in tiles.

Although the tile layout technique illustrated in FIG. 1 has significant efficiencies and benefits, the tile layout technique also has certain drawbacks. For example, the four corner regions 12–15 of the die cannot accommodate the same IOB tile and IOB tile structure as is present elsewhere along the periphery of the die. As set forth above, the architecture of FIG. 3 requires that an IOI tile be disposed between a pair of IOB tiles on the die edge and a corresponding CLB tile on the edge of the central core of the die. As can be seen in FIG. 3, the CLB tile nearest to a corner is bounded by an IOI tile, and yet additional die area in the corner region. If an additional IOI tile and a corresponding pair of IOB tiles were to be placed in the available space in the corner region, then there would be no CLB tile edge to which the added IOI tile could be abutted. Accordingly, the IOI tile mechanism for interfacing IOB tiles to the central core cannot easily be used in the four corner areas of the die.

In addition to the limited utility of corner regions 12–15, the tiles and layout technique of FIG. 1 also results in areas above and below the columns of BRAM/multiplier tiles having limited utility. As set forth above, the repeatable IOB tiles interface to CLB tiles through intervening IOI tiles. In the areas 16–27 above and below the BRAM/multiplier tile columns, there are no CLB tiles to interface to. IOB tiles and IOI tiles are therefore not placed in these areas. The result is an area along the periphery of the die that either is wasted or must have a tile that differs in structure from the IOB and interconnect and CLB tile structure used elsewhere on the periphery of the die.

FIG. 3 (Prior Art) is a diagram that shows one way that these corner regions 12–15 and areas 16–27 above and below the BRAM/multiplier tile columns are used in one conventional FPGA. In the example of FIG. 3, clock management circuitry is fitted into the areas 16, 21, 22 and 27 above and below the leftmost and rightmost columns of BRAM/multiplier tiles. Although these areas 16, 21, 22 and 27 are used, it is not necessarily the case that the amount of circuitry required by the clock management circuitry is the precise amount of area of regions 16–21, 22 and 27. A clock management circuit may, for example, occupy a smaller area than is available in one of these areas such that some of the area is left unused in the final die layout and is wasted. Alternatively, the amount of area that is desired for the functionality of the clock management circuit exceeds the amount of area that happens to have been left above and below the BRAM/multiplier tiles. In such case, some clock management functionality that is desired cannot be provided in the ultimate FPGA.

There is also an amount of area left above and below the center four columns of BRAM/multiplier tiles. These areas are designated in FIG. 1 by reference numbers 17–20 and 23–26. These areas are, in one specific design, used to provide high speed transceivers. Each transceiver, however, requires more die area than is left in one of the areas. Accordingly, the available area is expanded in the horizontal dimension one pair of IOB tile spaces to the left and one pair of IOB tile spaces to the right. The result is T-shaped transceiver tiles 28–35 as illustrated FIG. 3. Although this solution provides the extra space required to implement the desired transceiver circuitry, expanding the available die area by four IOB tile spaces might not provide the exact additional amount of extra space desired. More space than is desired may be provided resulting in wasted die area, or too little space may be provided resulting in less transceiver functionality being provided than is desired. The resulting T-shaped region puts a greater burden on design and layout to conform to the odd shaped hole which adds to development costs.

There is also an amount of area left in the corner areas 12–15 of the die. These areas are, in one specific case, used to accommodate other miscellaneous circuitry. This miscellaneous circuitry may, for example, include configuration logic, encryption/decryption logic, global clock driver circuitry, a performance monitor, and boundary scan circuitry. Again, as was the case with the areas above and below the columns of BRAM/multiplier tiles, these areas may provide more space or less space than is desired for the miscellaneous circuitry. The result is either wasted die area and/or less functionality than is desired. This circuitry must be divided between the four corners which can adversely impact performance, required area, and design/layout effort.

In addition to the problems set forth above, there is also another problem with the tile layout technique of FIG. 1. It is often the case that a particular circuit is most efficiently laid out in a particular shape. That shape is often not a square. In the case of the SRAM-based CLB design used in the FPGA integrated circuit of FIG. 1, for example, the CLB circuitry is most efficiently laid out as a rectangle. Because there are a great many CLB tiles in the FPGA integrated circuit of FIG. 1, the layout of the CLB tiles is optimized such that the size of the overall integrated circuit is reduced. Consequently, the CLB tile has a rectangular shape. Using this rectangular CLB tile shape, however, gives rise to a layout inefficiency.

Figure 4:
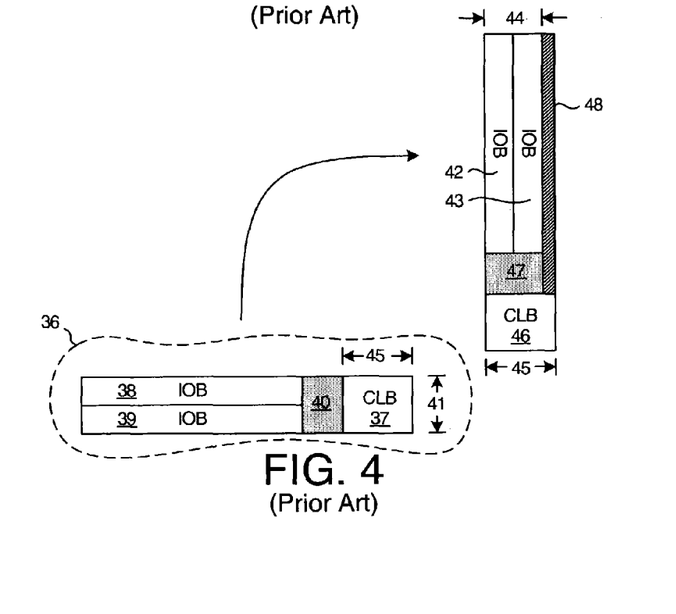
FIG. 4 (Prior Art) is a diagram that illustrates how placing IOB tiles on all four sides of a die can result in layout inefficiencies.

FIG. 4 (Prior Art) is a diagram that illustrates this layout inefficiency. The tiles within dashed line 36 represent tiles disposed along the leftmost side of FPGA integrated circuit 1. The tiles include a CLB tile 37, two IOB tiles 38 and 39, and an associated interconnection tile 40 disposed between the CLB tile and the IOB tiles. The IOB tiles are made of such a height that the combined height of the two stacked IOB tiles 38 and 39 is the same as the height 41 of CLB tile 37.

When the IOB tile is reoriented ninety degrees so that a pair of IOB tiles 42 and 43 is disposed along the upper side of FPGA die 1, however, the IOB tiles 42 and 43 do not have a combined width that is the same as the width of a CLB tile. The CLB tile is wider than it is tall. The combined width 44 of the vertically oriented IOB tiles 42 and 43 is therefore less than the width 45 of the associated CLB tile 46. Moreover, the IOI tile 47 disposed between CLB tile 46 and the two IOB tiles 42 and 43 is also reoriented ninety degrees and therefore also has a width 44 that is narrower than the width of the CLB tile. In one design, the same IOB tile layout is maintained for simplicity purposes and to provide identical performance on all four sides of the FPGA die. As a result, there is an extra amount of wasted space 48 associated with each CLB tile disposed along the top and bottom sides of FPGA die 1.

A solution is desired that minimizes and/or eliminates the above-described problems.

SUMMARY

The circuitry of an FPGA is laid out as a plurality of repeatable tiles. The word "tile" used herein means an area comprising circuitry with one or more programmable functions, including memory, or dedicated circuitry. A tile may, although not necessarily, include programmable interconnections such as a CLB tile. The tiles are disposed in columns. Each column extends all the way across the die from one side of the die (for example, the top side) to an opposite side of the die (for example, the bottom side). Each column consists essentially of tiles of only one type. Rather than providing a ring of input/output blocks (IOBs) around the periphery of the die that would break the columnar tile structure of the layout, the IOB tiles of the FPGA are disposed in columns only. Because the tiles of a column are of a single type, the width of the tiles of each column can be set independent of the size of tiles of other columns. The confines of the tile can therefore be set to match the size of the circuitry of the tile. The flexibility of being able to adjust the width of each type of tile in the layout process to match the amount of circuitry to be disposed in the tile results in layout efficiencies. Where a CLB tile is coupled to IOB tiles by an intervening IOI tile, the heights of the three types of tiles can be set such that the IOB tiles and IOI tile fit in the same laterally-extending slice of the FPGA die as the CLB tile. Because the IOB tiles are disposed in columns only, all the IOB tiles have the same orientation and can have the same layout.

In accordance with another aspect of the columnar floorplan technique, if an FPGA design requires more than two columns worth of IOBs, then more than two columns of IOB tiles are provided on the FPGA die. A column of IOB tiles need not be located along a side of the die because the requirement that the die be wire bondable is dropped. Rather than requiring each IOB tile to be associated with a bond pad that would force the IOB tile to be placed adjacent a side of the die so that the bond pad could be wire bonded to an integrated circuit package, the IOB tile in one embodiment of the present invention does not have an associated bond pad. Rather, the IOB tile is associated with a bond bump for flip-chip packaging purposes but does not have an associated wire bond pad. The bond bump for an IOB tile can be located in upper metalization layers of the die above circuitry but outside the lateral confines of the IOB tile. The bond bumps for a column of IOB tiles can therefore spill over both sides of the column of IOB tiles. The ability to spill bond bumps over both sides of the column allows additional flexibility in how the circuitry of IOB tile is laid out.

In accordance with another aspect, a tile is disposed in a central location on an FPGA die. A bond bump associated with the tile is also disposed in a central location on the FPGA die. The tile may, for example, be an IOB tile. A clock signal is received onto the FPGA die via the bond bump and tile. The clock signal passes from the bond bump, through a global clock buffer of the tile, and onto a clock distribution network. The clock distribution network distributes the clock signal across the FPGA die. By receiving the clock signal onto the die at a central location, best case speed is achieved and power consumption is minimized while maintaining the symmetric distribution that clocks require for low skew.

Another embodiment of the present invention includes an integrated circuit (IC) having programmable interconnections. The IC includes: two or more regions, where each region has a programmable circuit with a programmable function; and two or more column-like areas of the IC, wherein each column-like area extends from the top edge of the IC to the bottom edge of the IC, and wherein each column-like area includes predetermined regions, wherein the predetermined regions in a column-like area substantially fill the column-like area and wherein each of the predetermined regions in the column-like area includes programmable circuits substantially identical to programmable circuits in all the other predetermined regions in the column-like area.

Yet another embodiment of the present invention includes a die having an integrated circuit. The IC comprising: a first set of regions, where each region in the first set has an Input/Output circuit; a second set of regions, where each region in the second set has a circuit with a programmable logic function; a third set of columns, wherein a top of each column of the third set is positioned at a top side of the die and a bottom of each column of the third set is positioned at a bottom side of the die; a first column of the third set consisting essentially of regions from the first set; and a second column of the third set consisting essentially of regions from the second set, wherein the second column is interposed between the first column and a nearest side edge of the die.

Other structures and methods are described in the detailed description below. This summary does not purport to define the invention. The invention is defined by the claims.

DETAILED DESCRIPTION

Figure 5:
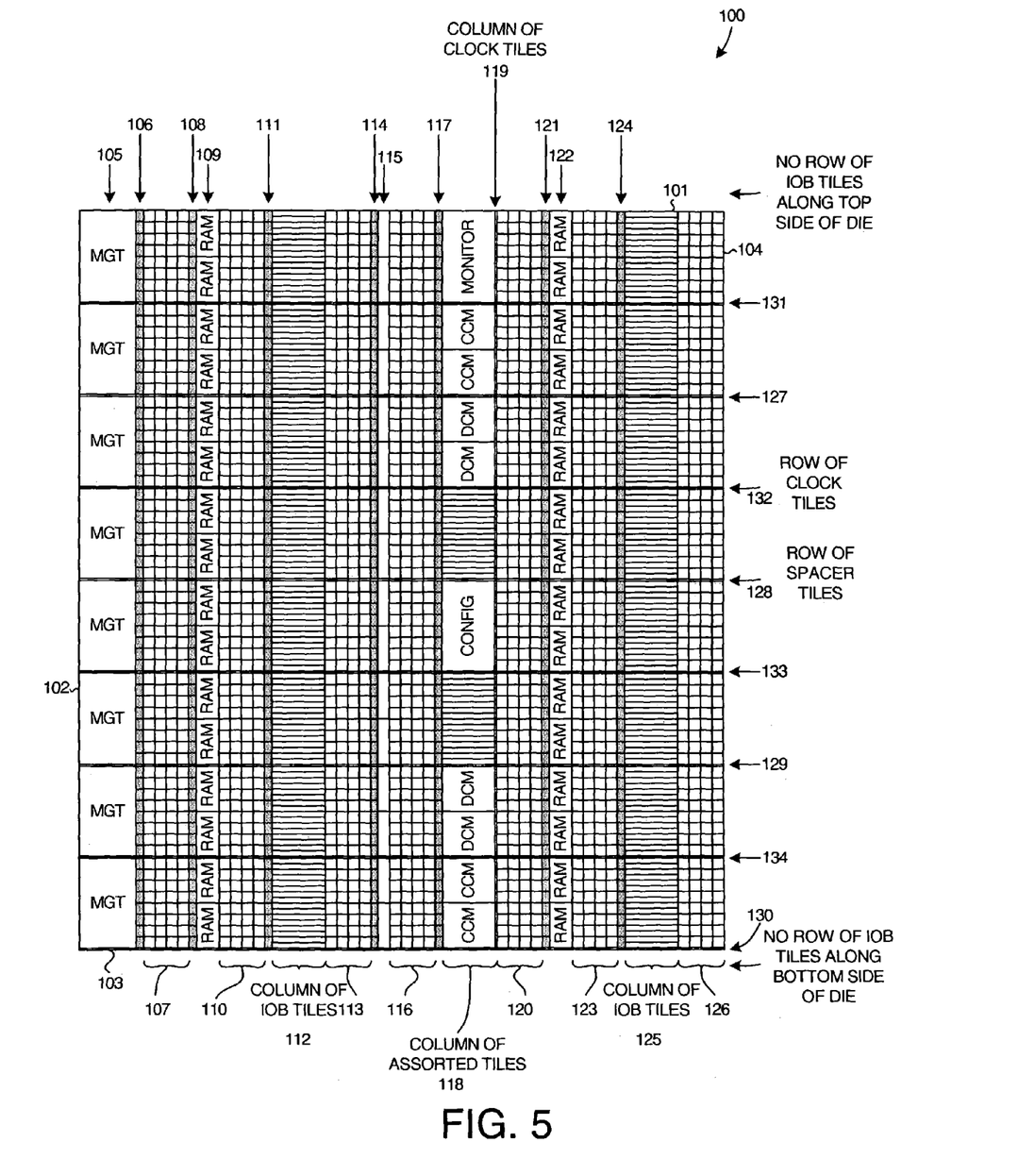
FIG. 5 is a simplified top-down diagram of an FPGA die in accordance with one embodiment of the present invention.

FIG. 5 is a simplified top-down diagram of a field programmable gate array (FPGA) integrated circuit die 100 in accordance with an embodiment of the present invention. FPGA die 100 is rectangular and has four sides 101–104. The circuitry of the FPGA is laid out across the surface of die 100 as a plurality of columns of repeatable tiles. Proceeding from the left side 102 of die 100 to the right side 104 of die 100, there is a column of identical multi-gigabit transceiver (MGT) tiles 105, a column of input/output interconnect (IOI) tiles 106, four columns of configurable logic block (CLB) tiles 107, a column of IOI tiles 108, a column of block random access memory (BRAM) tiles 109, four columns of CLB tiles 110, a column of IOI tiles 111, a column of input/output block (IOB) tiles 112, four columns of CLB tiles 113, a column of IOI tiles 114, a column of digital signal processing (DSP) tiles 115, four columns of CLB tiles 116, a column of IOI tiles 117, an irregular column 118 made up of multiple different types of tiles, a column of narrow clock distribution and configuration tiles 119, four columns of CLB tiles 120, a column of IOI tiles 121, a column of BRAM tiles 122, four columns of CLB tiles 123, a column of IOI tiles 124, a column of IOB tiles 125, and four columns of CLB tiles 126.

Note that the area of each of the columns of tiles but for the irregular column 118 is occupied primarily by a single type of tile. There are horizontally extending narrow clock distribution and configuration distribution tiles. There are also horizontally extending narrow spacer tiles. These clock distribution tiles and spacer tiles, however, occupy only a very small proportion of the total area of a column. Over ninety-five percent of the die area each of the columns 105–117 and 120–126 is occupied by a single type of tile.

The clock distribution tiles within each column line up with the clock distribution tiles in each of the other columns such that a horizontally extending clock distribution structure is formed that extends all the way across the die from left side 102 to right side 104. The horizontally extending clock distribution structures are indicated in FIG. 5 with reference numerals 131–134.

In the same way that the clock distribution tiles of the various columns line up to form structures that extend all the way across the die 100 in the horizontal dimension, so too do the spacer tiles of the various columns line up. In the example of FIG. 5, the spacer tiles line up to form horizontally extending spacer structures 127–130.

Of importance, the FPGA die 100 of FIG. 5 does not have IOB tiles disposed all along the top side 101 and the bottom side 103 of the die as is done in conventional FPGAs. Care is taken to lay out the circuitry of the CLB tile to occupy as small an amount of die area as is practical. The resulting CLB tile then has a particular CLB tile height. The IOI tile of FPGA die 100 is laid out to have this same height. The width of the IOI tile, on the other hand, is chosen so that the area of the resulting IOI tile is neither too large for the IOI circuitry desired, nor is too small for the IOI circuitry desired.

In the same way that the width of the IOI tile is flexible, so too is the width of the IOB tiles. The height of the IOB tile is set so that two IOB tiles stacked one on top of the other have the same combined height as the height of the CLB tile. The width of the IOB tile is then chosen so that the area of the resulting IOB tile is just large enough to accommodate the desired IOB circuitry. Because a stacked pair of IOB tiles in the particular layout of FIG. 5 is always disposed adjacent to an associated IOI tile everywhere on the die, the wasting of die area described above in connection with the prior art problem of FIG. 4 is not encountered. Because the tiles of a particular column are of the same type (but for the incidental and relatively small clock distribution tiles and spacer tiles), the width of the type of tile in the column can be set to provide precisely the amount of die area needed for the circuitry of the tile. The result is an efficient use of die area.

In addition to the efficient use of die area, the layout process and the associated engineering effort in laying out the circuitry is simplified in comparison to the prior art tile layout technique of FIG. 3. In the conventional FPGA tile structure of FIG. 3, for example, there are two versions of the IOB tile, one for use on the left and right sides of the die, and another for use on the top and bottom sides of the die. As set forth above in connection with FIG. 4, the layout of the IOB tiles on the top and bottom sides of the die resulted in wasted die space. In contrast, the FPGA die 100 of FIG. 5 involves only a single IOB tile layout. The engineering effort and associated expense and delay in laying out two IOB tiles is therefore avoided and identical timing is more easily achieved.

Also note that the structure of FIG. 5 does not involve corner regions created due to the die being ringed by IOB tiles and due to the IOB tiles not being able to be extended into the corner regions. In the embodiment of FIG. 5, the tile structure in the top-left corner and in the bottom-left corner of the die is the same as the tile structure in the rest of the leftmost column 105 of tiles. Similarly, the CLB tile structure in the top-right corner and the CLB tile structure in the bottom-right corner of the die is the same as the tile structure in the rest of the rightmost column of CLB tiles.

In the FPGA integrated circuit of FIG. 5, there are parts of the overall FPGA circuit that take up a relatively small amount of die area compared to the area occupied by the CLB tiles, IOB tiles, transceiver tiles, and multiplier tiles. These parts of the FPGA circuit include, for example, a performance monitor circuit, a digital clock manager (DCM) circuit, a clock companion module (CCM) circuit, and configuration logic. The configuration logic includes logic needed to address and load the configuration memory cells of the SRAM-based FPGA during configuration of the FPGA. The configuration logic in this example also includes boundary scan test circuitry such as JTAG circuitry, and encryption and decryption circuitry used to encrypt and decrypt bitstreams of configuration data loaded into and read out of the FPGA. This configuration logic is centralized in one location. This avoids the inefficiency and effort of partitioning the configuration logic into the four corners of the die. It also allows internally generated configuration signals to reach the entire die faster because these signals are starting from a central location.

Where these parts of the overall FPGA circuit can be efficiently provided in a localized area, each such part is laid out as a tile. These tiles are then disposed in a central column 118. Because there are multiple types of tiles of different types in this column 118, the width of each type of tile is not freely adjustable irrespective of the width of the other types of tiles in the column. Some layout inefficiencies therefore may result in this center column. The area of the irregular column 118 is, however, relatively small as compared with the remainder of FPGA die 100 where the area of each column is occupied primarily by tiles of only one type. In the embodiment of FIG. 5, the irregular column 118 occupies less than one tenth of the total die area of FPGA die 100.

The miscellaneous circuitry that was provided in the corner regions 12–15 of the conventional layout of FIG. 3 still has to be laid out, but its layout is simpler because it does not have to be partitioned to fit into four unique tiles. Rather, the miscellaneous circuitry is more easily laid out in the embodiment of FIG. 5 in the single, relatively centrally-located, configuration logic tile of column 118. Where the die area available for this miscellaneous circuitry was determined by the area of the corner regions 12–15 in the conventional layout of FIG. 3, the height of the single configuration logic tile in the embodiment of FIG. 5 can be increased or decreased (within reasonable constraints of aligning to the CLBs) as necessary to provide more or less die area. Accordingly, the embodiment of FIG. 5 provides more flexibility in the layout of the miscellaneous circuitry in comparison to the conventional layout of FIG. 3.

It is often the case that a general purpose FPGA integrated circuit should have more input/output resources than can be efficiently provided in just two columns of IOB tiles. In the embodiment of FIG. 5, there can be more than two columns of IOB tiles. Rather than providing a bond pad for each IOB tile, only bond bumps are provided for each IOB tile. By not requiring the die to be wire-bondable to a wire bond package, there is no requirement that an IOB tile be disposed adjacent a side of the die. This allows IOB tiles to be disposed in more than three columns. If the number of desired additional IOB tiles is not enough to form a complete third column, then extra IOB tiles can be disposed in the irregular central column 118 along with other types of tiles. In the example of FIG. 5, the width of the IOB tiles determines the width of the other tiles in irregular column 118. The number of IOB tiles in the embodiment of FIG. 5 is therefore freely expandable and is not limited by the requirement of having to place an IOB tile adjacent to a side of the die.

Figure 6:
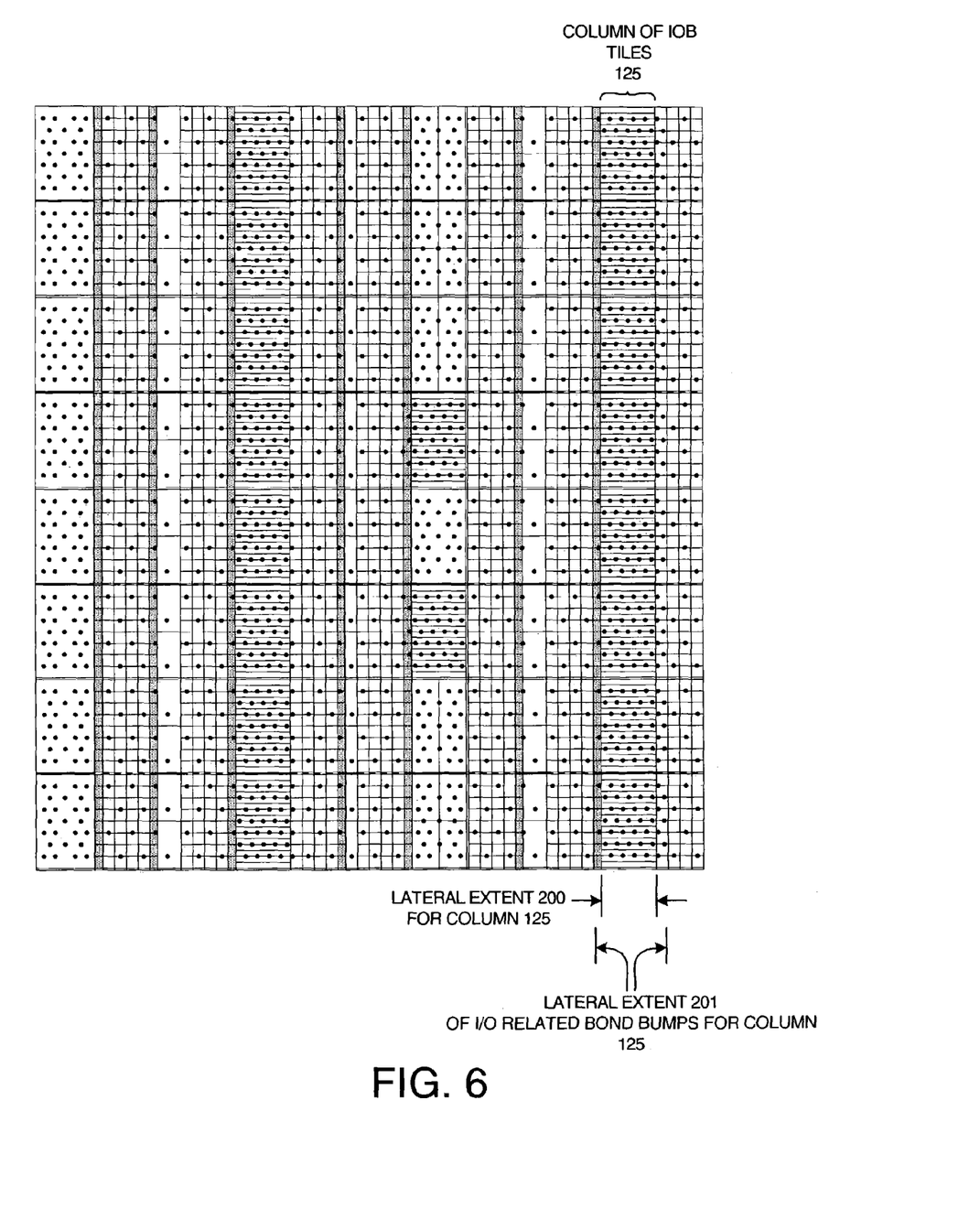
FIG. 6 is a simplified top-down diagram that shows how bond bumps are disposed across the FPGA die of FIG. 5.

FIG. 6 is a diagram that illustrates a pattern of bond bumps disposed across the upper planar surface of FPGA die 100. Due to design rule requirements, there is a minimum amount of space required between adjacent bond bumps. This design rule requirement sets a maximum packing density of the bond bumps. If the bond bumps associated with an IOB tile had to be disposed directly above the IOB tile, then the packing density of the bond bumps might set the minimum size of the IOB tile. Alternatively, requiring the bond bumps associated with an IOB tile to be disposed directly above the IOB tile could cause the IOB tile to have a shape not conducive to an efficient layout of the IOB circuitry.

In accordance with one aspect of the present invention, the bond bump of an IOB tile is not disposed directly above the IOB tile but rather is disposed outside the lateral boundary of the IOB tile. In the example of FIG. 6 where IOB tiles are disposed in a column 125, the bond bumps of the various IOB tiles making up column 125 spill over on both the left side and the right side of the column. Note, for example, that the lateral extent 201 of the bond bumps for the IOB tiles of column 125 extends beyond the lateral extent 200 of column 125 both to the left of the leftmost edge of column 125 as well as to the right of the rightmost edge of column 125. The ability to have the bond bumps of a column of IOB tiles spill over each side of the column provides an additional degree of layout flexibility in comparison to a conventional IOB tile that must be disposed adjacent a side of the die. Where a column of conventional IOB tiles is disposed along a side of a die, the bond bumps and/or bond pads associated with the column cannot extend past the edge of the IOB tiles in the direction of the side of the die. In the example of FIG. 6, the other bond bumps that are not associated with an IOB tile or a transceiver tile are used for power and ground.

Figure 7:
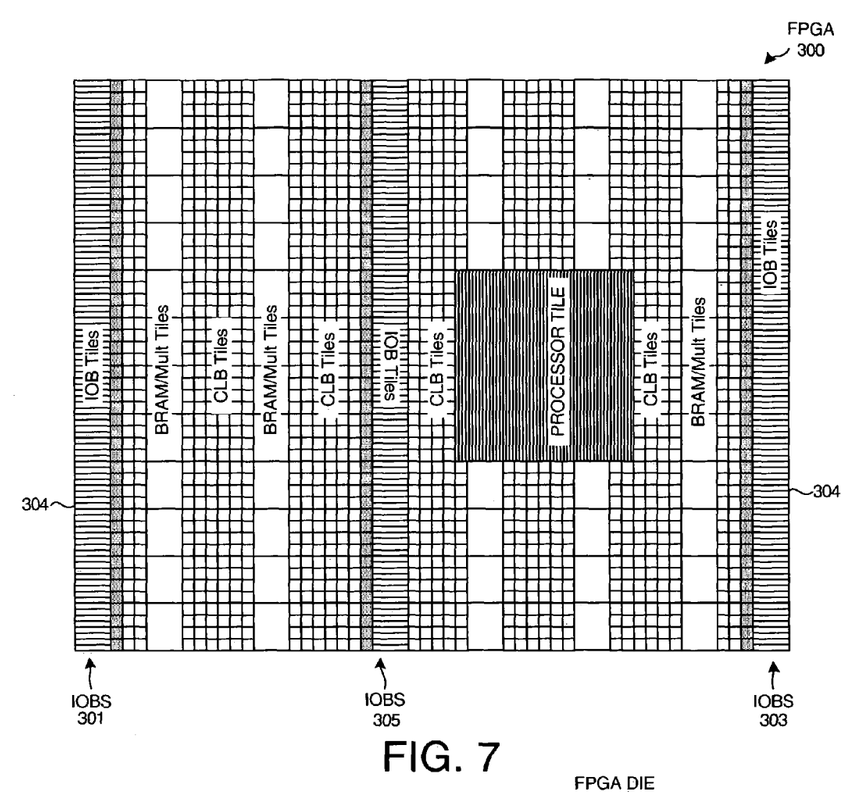
FIG. 7 is a simplified top-down diagram of an FPGA die that has three columns of IOB tiles in accordance with an embodiment of the present invention.

FIG. 7 is a simplified diagram of an FPGA die 300 in accordance with another embodiment of the present invention. A column 301 of IOB tiles is disposed adjacent the left side 302 of die 300. A column 303 of IOB tiles is disposed adjacent to the right side 304 of die 300. Additional IOB tiles are provided in another column 305 of IOB tiles. FIG. 7 illustrates an example of an FPGA die having more than two complete columns of IOB tiles. Because the IOB tiles of these columns are disposed along a side of the die, the bond bumps of these IOB tiles cannot spill over both the left and right boundaries of these columns. In the example of FIG. 7, the layout of the IOB tiles in the column along the right side of the die is the mirror image of the layout of the IOB tiles in the column along the left side of the die. Accordingly, all IOB tiles on the die have a layout of a first orientation or of a second orientation that is the mirror image of the first orientation.

Figure 8:
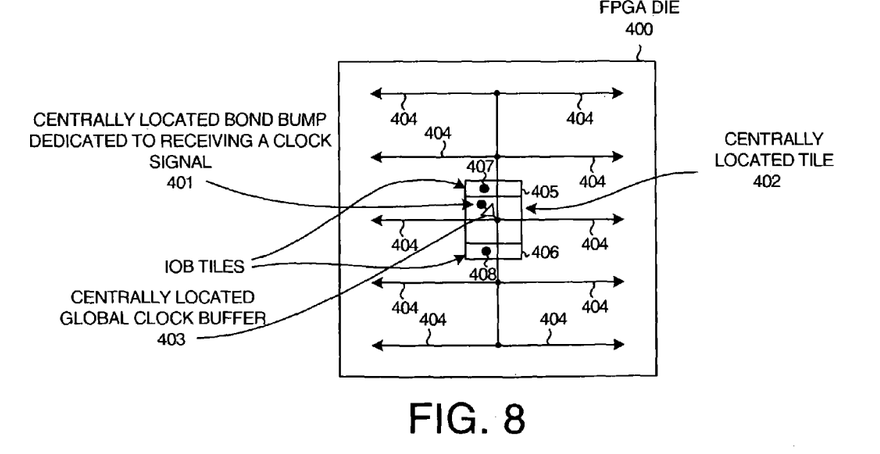
FIG. 8 is a simplified top-down diagram that illustrates how a clock signal is received onto an FPGA die through a centrally located bond bump and tile in accordance with an embodiment of the present invention.

FIG. 8 is a simplified diagram in accordance with another aspect of the present invention. In a conventional FPGA such as the FPGA die of FIG. 3, each IOB tile provided is disposed adjacent an edge of the die. Where the IOB tile is used to receive a clock signal onto the FPGA (either an input/output tile could be used for this purpose or a special clock input tile could be used for this purpose), this clock signal is driven from a driver located in the tile toward a central location on the die. From the central location on the die, the signal enters into a clock tree which distributes the clock signal back outward and to the various parts of the FPGA circuitry in a symmetric manner to reduce clock skew. The clock signal is often a relatively high frequency clock signal and consequently power is consumed in driving the high frequency clock signal from the tile on the side of the die to the central location.

In accordance with one embodiment of the present invention, a clock signal is received onto the FPGA die via a substantially centrally located bond bump 401 and an associated substantially centrally located tile 402. Bond bump 401 is a dedicated bond bump for receiving a clock signal. The clock signal passes from bond bump 401, through a clock buffer 403 in tile 402, and then into a clock distribution network 404. Clock distribution network 404 conducts the clock signal outward across the surface of die 400 to the various parts of the FPGA circuit. By receiving the clock signal on the centrally located bond bump and tile, power consumption and delay are reduced. A more logical and symmetrical circuit layout of the clock circuitry is also realized.

In one embodiment, the centrally located tile through which the clock signal enters the clock distribution network is the substantially centrally located configuration tile (see the configuration tile in column 118 of FIG. 5). In this embodiment, the substantially centrally located bond bump used to receive the clock signal is not bond bump 401 of tile 402, but rather the substantially centrally located bond bump is a bond bump of an IOB tile that neighbors tile 402. FIG. 8 shows two such IOB tiles 405 and 406. Each of these IOB tiles 405 and 406 has a bond bump. Bond bump 407 is the bond bump of IOB tile 405. Bond bump 408 is the bond bump of IOB tile 406. The clock signal passes onto the FPGA die through the bond bump of one of the IOB tiles, through an input buffer in that IOB tile, and then through a dedicated interconnect structure and to the centrally located tile 402. Within tile 402 the signal passes onto the clock distribution network 404. The clock signal may or may not be buffered by a global clock buffer in tile 402.

In the specific embodiment of FIG. 5, the IOB tiles usable to receive clock input signals onto the FPGA are the IOB tiles located above and below the configuration tile in the central column 118 of FIG. 5. Each of these IOB tiles is usable in a user-specific design as an ordinary IOB to receive or output non-clock signals. Alternatively, each of these IOB tiles is usable to receive a clock signal that is supplied to the clock distribution network as explained above. This clock signal can be a differential signal and the clock distribution network can be a differential clock tree. For example, a differential clock signal can be received onto two bond bumps of the IOB tile used to receive the clock signal onto the die. These two bond bumps can be located in a central location on the die. The differential clock signal can then be communicated by a pair of global clock buffers onto the clock distribution network. The clock signal can be a single ended signal as it is propagated through a part of the clock distribution network, and can be a differential signal as it is propagated through another part of the clock distribution network.

Figure 9:
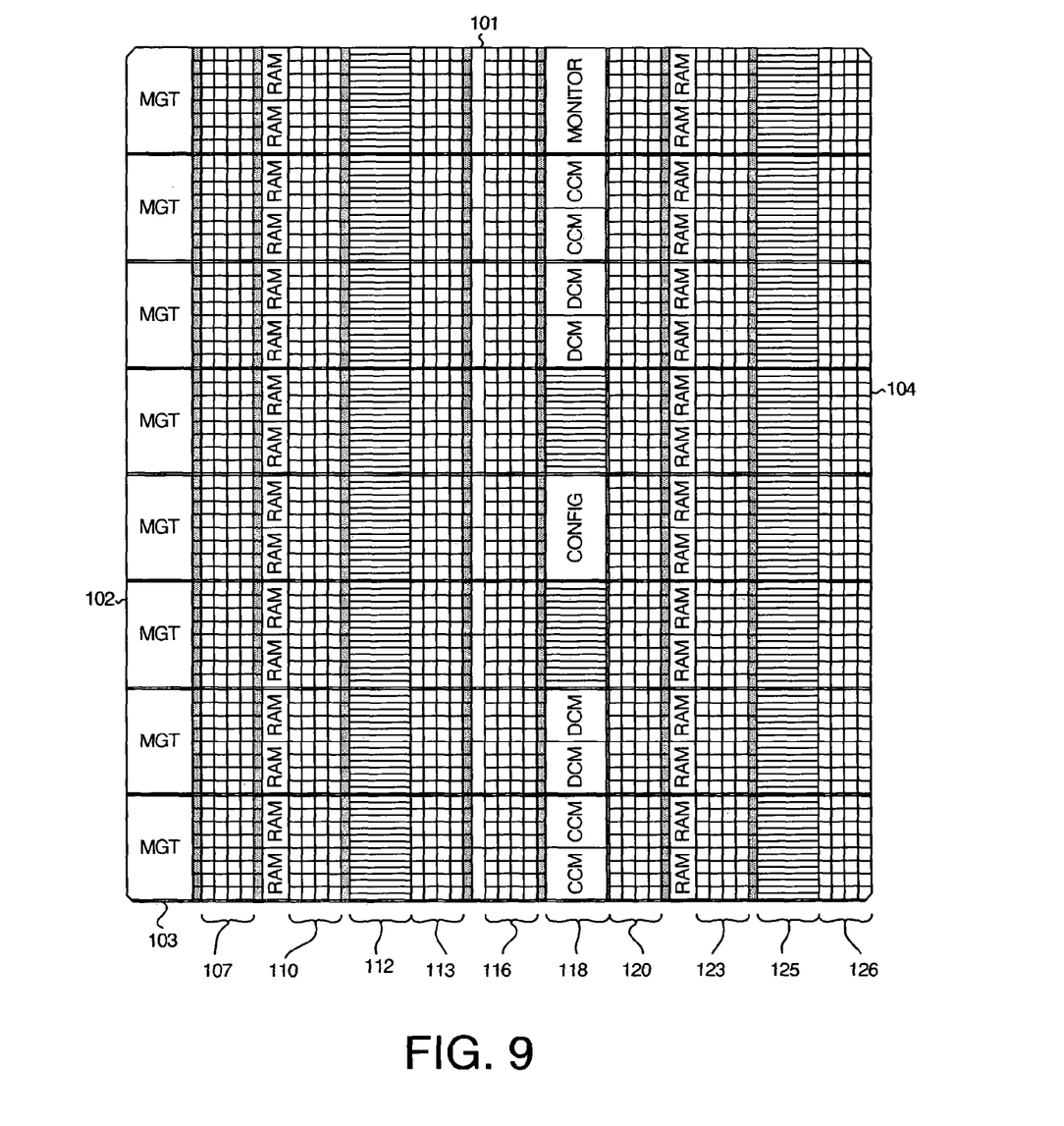
FIG. 9 is a simplified top-down diagram of a rectangular FPGA die having clipped corners.

Although a rectangular FPGA die is illustrated in FIGS. 5–7 in simplified form as being perfectly rectangular, a rectangular die in accordance with an embodiment of the present invention can be a die that has each of its four corners clipped. FIG. 9 is a top-down diagram of one such rectangular FPGA die. To avoid the circuitry in the bottom left MGT tile and the upper left MGT tile from being cut off when the bottom left and upper left corners of the die are clipped off, the circuitry of the MGT tile is laid out so that there is no circuitry in the upper left and lower left corners of the tile. To avoid the circuitry of a CLB tile in the lower right of the die and the circuitry in a CLB tile in the upper right of the die from being cut off when the upper right and lower right corners of the die are clipped off, no CLB tiles are actually placed in these corner locations. Rather, each of the lower right and upper right corner regions of the die includes a blank region the size of a CLB tile. Although not illustrated in FIG. 9, each of the CLB tiles that would otherwise border a side of the die may rather have a very thin termination tile disposed between it and the side of the die. The very thin termination tile terminates conductors that extend to the edges of the CLB tile and would otherwise be connected to conductors within an adjacent CLB tile if there were another adjacent CLB tile but for the adjacent CLB tile not being present due to the side of the die. When it is said that a column of configurable logic block tiles extends from a first side of the die to a second side of the die such that a first CLB is disposed adjacent the first side and such that a second CLB tile is disposed adjacent the second side, the presence of thin termination tiles is ignored.

Although certain specific exemplary embodiments are described above in order to illustrate the invention, the invention is not limited to the specific embodiments. Although a specific embodiment of a columnar floorplan die is described above wherein more than ninety-five percent of the die area of each one of essentially all its columns is occupied by a single type of tile, substantial advantages can be achieved in accordance with teachings of this patent document by making one or more of these columns to have slightly less than ninety-five percent of its die area occupied by a single type of tile. Such substantial advantages include simplification of the layout process. Such substantial advantages may include a reduction in the amount of engineering effort required to layout the die. Such substantial advantages may include a reduction in the amount of time required to layout the die. Achieving these substantial advantages is a teaching of this patent document.

Although columns of IOB tiles are described that have only a single type of IOB tile, this need not be the case. A column may, for example, include multiple types of IOB tiles. In one embodiment these multiple types of IOB tiles are, however, repeated in a pattern down the column of IOB tiles such that the repeated pattern can itself be considered an IOB tile, wherein the IOB tile is made up of multiple IOB sub-tiles. The same repeated pattern of tiles can be used in columns of other types of tiles such that there may be multiple types of sub-tiles in those columns as well. Also, a column of IOB tiles may include a few interface tiles that occupy the same die area as the bulk of the other IOB tiles of the columns, but that have different circuitry that is not necessarily laid out in the most optimized way within geometry of the other IOB tiles. Such interface tiles may, for example, include a clock input tile.

Accordingly, various modifications, adaptations, and combinations of various features of the described embodiments can be practiced without departing from the scope of the invention as set forth in the following claims.

What is claimed is:

1. An integrated circuit (IC) having programmable interconnections, comprising:
    a first plurality of regions, each region having a programmable circuit with a programmable function; and
    a second plurality of areas of the IC, wherein each area of the second plurality extends from one edge of the IC to an opposing edge of the IC, and wherein each area of the second plurality comprises predetermined regions of the first plurality, wherein the predetermined regions in an area are in a column and substantially fill the area, and wherein each of the predetermined regions in a first area comprises programmable circuits which are substantially identical and have a first function and each of the predetermined regions in a second area comprises programmable circuits which are substantially identical and have a second function.

2. The integrated circuit of claim 1 further comprising a third area of said second plurality of areas wherein every predetermined region in the predetermined regions in the third area has a circuit of only one circuit type, the circuit type selected from a group consisting of Configurable Logic Block (CLBs), Multi-Giga Bit Transceivers (MGTs), Block Random Access Memories (BRAMs), Digital Signal Processor (DSP) circuits, Multipliers, and Input/Output Blocks (IOBs).

3. The integrated circuit of claim 1 wherein an area of the second plurality has predetermined regions comprising Multi-Giga Bit Transceiver (MGT) circuits.

4. The integrated circuit of claim 1 further comprising a heterogeneous area of said second plurality of areas of the IC, the heterogeneous area having regions with programmable circuits that are of different circuit types.

5. A die having an integrated circuit, comprising:
    a first set of regions, each region in the first set having an Input/Output circuit;
    a second set of regions, each region in the second set having a circuit with a programmable logic function;
    a third set of columns, wherein a top of each column of the third set is positioned at a top side of the die and a bottom of each column of the third set is positioned at a bottom side of the die;
    a first column of the third set, wherein each region of the first column consisting essentially of regions from the first set; and
    a second column of the third set consisting essentially of regions from the second set, wherein the second column is interposed between the first column and a nearest side edge of the die.

6. The die of claim 5 wherein an Input/Output circuit comprises a Multi-Giga Bit Transceiver or an input/output block or a combination thereof.

7. The die of claim 5 further comprising a third column of the third set positioned at a center line of the die, the third column comprising assorted tiles.

8. A method, comprising:
    providing a plurality of configurable logic blocks in a first column having the same function, the first column extending from a first side of an integrated circuit die to a second side of the integrated circuit die;
    providing a plurality of Input/Output blocks in a second column, the second column extending from the first side of the integrated circuit die to the second side of the integrated circuit; and
    providing a plurality of tiles in a third column extending from the first side of the integrated circuit die to the second side of the integrated circuit die, the plurality of tiles in the third column having different functions than the function of the first column.

9. The method of claim 8, further comprising:
    providing a first input/output block on a first side of the first column; and
    providing a second input/output block on a second side of the first column.

10. The method of claim 8, wherein there is no input/output block disposed between the column of configurable logic blocks and the first side of the integrated circuit die.

11. The method of claim 8, wherein the first column includes the plurality of configurable logic blocks as well as a plurality of clock distribution tiles.

12. The method of claim 8, wherein over ninety-five percent of the die area of the first column is occupied by configurable logic blocks.

13. An integrated circuit, comprising:
a first column of input/output block tiles, wherein the first column of input/output tiles occupies a die area, and wherein over ninety-five percent of the die area of the column is occupied by input/output block tiles;
a first configurable logic block tile disposed on a first side of the first column;
a second configurable logic block tile disposed on a second side of the first column opposite the first side; and
a second column of input/output block tiles disposed on an end of the integrated circuit.

14. The integrated circuit of claim 13, wherein each of the input/output block tiles in the first column has an identical layout.

15. The integrated circuit of claim 13, wherein the integrated circuit is a field programmable gate array.

16. The integrated circuit of claim 13, wherein the integrated circuit is disposed on a semiconductor die, the semiconductor die having a first side, a second side opposite the first side, a third side, and a fourth side opposite the third side, and wherein the first column of input/output block tiles extends from the first side and to the second side, a first input/output block tile of the first column being disposed adjacent the first side of the die, a second input/output block tile of the first column being disposed adjacent the second side of the die.

17. An integrated circuit comprising:
a plurality of configurable logic block tiles;
a plurality of input/output block tiles disposed in columns, each of the columns extending in a first direction, wherein no two input/output block tiles of the integrated circuit are disposed adjacent to one another to form a row that extends in a second direction perpendicular to the first direction; and
a plurality of tiles disposed in a column on an end of the integrated circuit, wherein the plurality of tiles comprises a plurality of transceivers.

18. The integrated circuit of claim 17, wherein the integrated circuit comprises at least three columns of input/output block tiles.

19. An integrated circuit consisting essentially of tiles, the integrated circuit comprising:
an input/output block tile having four sides and in a column of input/output block tiles extending from a first end to a second end, wherein the input/output block tile is bounded on each of its four sides by another tile; and
a plurality of tiles in a second column extending from a first end to a second end, wherein the plurality of tiles comprises memory cells.

* * * * *